US011735648B2

(12) United States Patent
Yu et al.

(10) Patent No.: US 11,735,648 B2
(45) Date of Patent: Aug. 22, 2023

(54) EPITAXIAL STRUCTURES FOR FIN-LIKE FIELD EFFECT TRANSISTORS

(71) Applicant: Taiwan Semiconductor Manufacturing Co., Ltd., Hsin-Chu (TW)

(72) Inventors: Chia-Ta Yu, New Taipei (TW); Sheng-Chen Wang, Hsinchu (TW); Feng-Cheng Yang, Hsinchu County (TW); Yen-Ming Chen, Hsin-Chu County (TW); Sai-Hooi Yeong, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 14 days.

(21) Appl. No.: 17/324,512

(22) Filed: May 19, 2021

(65) Prior Publication Data
US 2021/0280696 A1    Sep. 9, 2021

Related U.S. Application Data

(60) Continuation of application No. 16/895,417, filed on Jun. 8, 2020, now Pat. No. 11,018,245, which is a
(Continued)

(51) Int. Cl.
*H01L 29/66* (2006.01)
*H01L 29/423* (2006.01)
(Continued)

(52) U.S. Cl.
CPC .. *H01L 29/66803* (2013.01); *H01L 21/02532* (2013.01); *H01L 21/02636* (2013.01);
(Continued)

(58) Field of Classification Search
CPC ......... H01L 29/66803; H01L 29/42384; H01L 29/66795; H01L 29/785; H01L 29/7851;
(Continued)

(56) References Cited

U.S. PATENT DOCUMENTS 7,074,662 B2   7/2006 Lee et al.
8,263,451 B2   9/2012 Su et al.
(Continued)

FOREIGN PATENT DOCUMENTS

TW   201137942 A   11/2011
TW   201212467 A    3/2012
(Continued)

*Primary Examiner* — Dao H Nguyen
(74) *Attorney, Agent, or Firm* — Haynes and Boone, LLP

(57) ABSTRACT

A semiconductor structure includes a first fin and a second fin protruding from a substrate, isolation features over the substrate to separate the first and the second fins, where a top surface of each of the first and the second fins is below a top surface of the isolation features, inner fin spacers disposed along inner sidewalls of the first and the second fins, where the inner fin spacers have a first height measured from a top surface of the isolation features, outer fin spacers disposed along outer sidewalls of the first and the second fins, where the outer fin spacers have a second height measured from the top surface of the isolation features that is less than the first height, and a source/drain (S/D) structure merging the first and the second fins, where the S/D structure includes an air gap having a top portion over the inner fin spacers.

20 Claims, 17 Drawing Sheets

Related U.S. Application Data division of application No. 15/962,500, filed on Apr. 25, 2018, now Pat. No. 10,680,084.

(60) Provisional application No. 62/584,254, filed on Nov. 10, 2017.

(51) Int. Cl.

| | | |
|---|---|---|
| *H01L 29/78* | (2006.01) | |
| *H01L 21/02* | (2006.01) | |
| *H01L 21/8234* | (2006.01) | |
| *H01L 21/8238* | (2006.01) | |
| *H01L 27/12* | (2006.01) | |
| *H01L 21/84* | (2006.01) | |

(52) U.S. Cl.
CPC ............. *H01L 21/823431* (2013.01); *H01L 21/823821* (2013.01); *H01L 27/1211* (2013.01); *H01L 29/42384* (2013.01); *H01L 29/66795* (2013.01); *H01L 29/785* (2013.01); *H01L 29/7851* (2013.01); *H01L 21/845* (2013.01); *H01L 29/66545* (2013.01)

(58) Field of Classification Search
CPC ......... H01L 29/66545; H01L 21/02532; H01L 21/02636; H01L 21/823431; H01L 21/823821; H01L 21/845; H01L 27/1211
USPC ........................................................ 257/288
See application file for complete search history.

(56) References Cited

U.S. PATENT DOCUMENTS

| | | | |
|---|---|---|---|
| 8,598,025 B2 | 12/2013 | Steen et al. | |
| 8,722,520 B2 | 5/2014 | van Dal | |
| 8,772,109 B2 | 7/2014 | Colinge | |
| 8,785,285 B2 | 7/2014 | Tsai et al. | |
| 8,816,444 B2 | 8/2014 | Wann et al. | |
| 8,823,065 B2 | 9/2014 | Wang et al. | |
| 8,836,016 B2 | 9/2014 | Wu et al. | |
| 8,841,701 B2 | 9/2014 | Lin et al. | |
| 8,846,508 B1 | 9/2014 | England et al. | |
| 8,847,293 B2 | 9/2014 | Lee et al. | |
| 8,853,025 B2 | 10/2014 | Zhang et al. | |
| 8,860,148 B2 | 10/2014 | Hu et al. | |
| 8,962,400 B2 | 2/2015 | Tsai et al. | |
| 9,093,367 B2 | 7/2015 | Liu et al. | |
| 9,093,514 B2 | 7/2015 | Tsai et al. | |
| 9,105,490 B2 | 8/2015 | Wang et al. | |
| 9,105,559 B2 | 8/2015 | Basker et al. | |
| 9,166,010 B2 | 10/2015 | Kelly et al. | |
| 9,236,267 B2 | 1/2016 | De et al. | |
| 9,236,300 B2 | 1/2016 | Liaw | |
| 9,245,805 B2 | 1/2016 | Yeh et al. | |
| 9,299,564 B2 | 3/2016 | Waite et al. | |
| 9,362,175 B2 | 6/2016 | Tsai et al. | |
| 9,461,168 B1 | 10/2016 | Ok et al. | |
| 9,472,620 B1 | 10/2016 | Wang et al. | |
| 9,520,482 B1 | 12/2016 | Chang et al. | |
| 9,576,814 B2 | 2/2017 | Wu et al. | |
| 9,601,575 B2 * | 3/2017 | Jung ................... H01L 29/7851 | |
| 9,935,199 B2 | 4/2018 | Ching et al. | |
| 10,269,932 B1 | 4/2019 | Arya et al. | |
| 11,043,424 B2 * | 6/2021 | Huang ............. H01L 29/66795 | |
| 2011/0195555 A1 | 8/2011 | Tsai et al. | |
| 2012/0138886 A1 | 6/2012 | Kuhn et al. | |
| 2013/0023104 A1 | 1/2013 | Isogai | |
| 2013/0187206 A1 | 7/2013 | Mor et al. | |
| 2013/0187228 A1 | 7/2013 | Xie et al. | |
| 2013/0244392 A1 | 9/2013 | Oh et al. | |
| 2013/0249019 A1 | 9/2013 | Kelly et al. | |
| 2014/0065782 A1 * | 3/2014 | Lu ..................... H01L 29/41791 | |
| | | | 257/E21.409 |
| 2014/0073105 A1 | 3/2014 | Isogai | |
| 2014/0120691 A1 | 5/2014 | Lee et al. | |
| 2014/0175554 A1 | 6/2014 | Loubet et al. | |
| 2014/0203338 A1 | 7/2014 | Kelly | |
| 2015/0236124 A1 | 8/2015 | Chang et al. | |
| 2016/0079367 A1 | 3/2016 | Yoo et al. | |
| 2016/0149036 A1 | 5/2016 | Huang et al. | |
| 2016/0218104 A1 | 7/2016 | Wen et al. | |
| 2016/0315081 A1 * | 10/2016 | Park .................. H01L 29/41791 | |
| 2017/0069737 A1 | 3/2017 | Choi et al. | |
| 2017/0098648 A1 * | 4/2017 | Lee ..................... H01L 29/7848 | |
| 2017/0317213 A1 | 11/2017 | Park et al. | |
| 2017/0345911 A1 | 11/2017 | Yu | |
| 2018/0211883 A1 | 7/2018 | Cheng | |
| 2018/0286863 A1 * | 10/2018 | Holt ................ H01L 21/823814 | |

FOREIGN PATENT DOCUMENTS

| | | |
|---|---|---|
| TW | 201409581 A | 3/2014 |
| TW | 201507156 A | 2/2016 |
| TW | 201635534 A | 10/2016 |
| TW | 201711093 A | 3/2017 |
| WO | WO-2015080945 A1 | 6/2015 |

* cited by examiner

EPITAXIAL STRUCTURES FOR FIN-LIKE FIELD EFFECT TRANSISTORS

CROSS-REFERENCE TO RELATED APPLICATIONS

This application is a continuation of U.S. patent application Ser. No. 16/895,417 filed Jun. 8, 2020, which is a division of U.S. patent application Ser. No. 15/962,500 filed Apr. 25, 2018, which claims priority to U.S. Provisional Patent Application Ser. No. 62/584,254 filed Nov. 10, 2017, the entire disclosure of which is hereby incorporated herein by reference.

BACKGROUND

The integrated circuit (IC) industry has experienced exponential growth. Technological advances in IC materials and design have produced generations of ICs, where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, three-dimensional fin-like field effect transistor (FinFET) has been introduced to replace a planar transistor. Although existing FinFET devices and methods of fabricating the same have been generally adequate for their intended purposes, they have not been entirely satisfactory in all respects. For example, as FinFET technologies have enabled progress towards smaller feature sizes (such as 32 nanometers, 28 nanometers, 20 nanometers, and below), improving properties of source/drain epitaxial features raise challenges in device design and fabrication processes.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
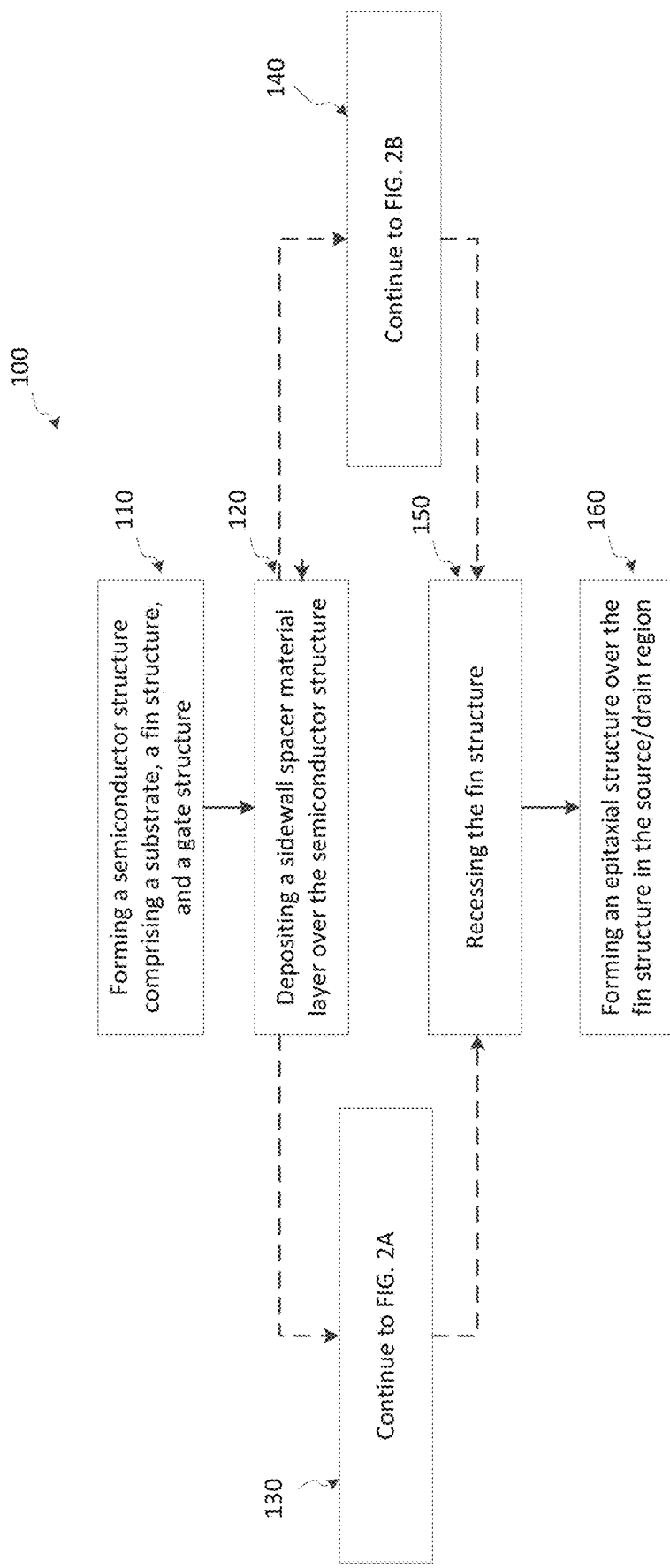
FIG. 1 is a flowchart of an exemplary method for fabricating a semiconductor structure comprising a fin field effect transistor (FinFET) device according to various aspects of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc., as well as derivatives thereof (e.g., "horizontally," "downwardly," "upwardly," etc.) are used for ease of the present disclosure of one features relationship to another feature. The spatially relative terms are intended to cover different orientations of the device including the features. Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The present disclosure relates generally to integrated circuit devices, and more particularly, to fin-like field effect transistor (FinFET) devices. The FinFET devices, for example, may be complementary metal-oxide-semiconductor (CMOS) devices comprising a p-type metal-oxide-semiconductor (PMOS) FinFET device and an n-type metal-oxide-semiconductor (NMOS) FinFET device. The following disclosure will continue with a FinFET example to illustrate various embodiments of the present application. It is understood, however, that the application should not be limited to a particular type of device.

FIG. 1 is a flowchart of method 100 for fabricating FinFET devices according to some aspects of the present disclosure. Method 100 begins with step 110, which includes forming a semiconductor structure 200. The semiconductor structure 200, as shown in an embodiment in FIG. 3, includes a semiconductor substrate 210, a fin structure 220 that includes two separate fins 222 separated by isolation regions 230, and a gate structure 240 that includes various materials layers such as, for example, a dielectric layer 250, a gate electrode layer 246, and a hard mask layer 248. It is understood that additional devices and features may also be present on the semiconductor structure 200 and any variations thereof according to aspects of the present disclosure.

Figure 3:
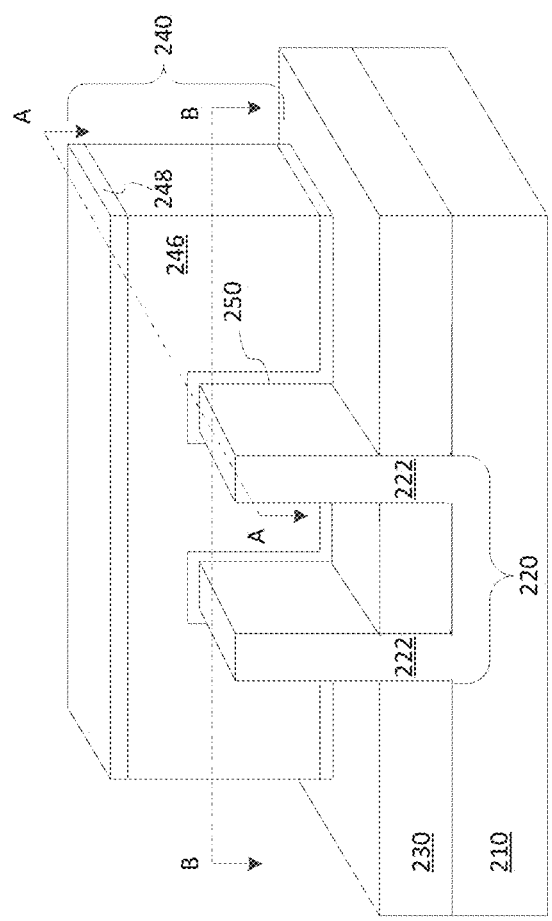
FIG. 3 is a perspective, three-dimensional view of a semiconductor structure according to various aspects of the present disclosure.

It is further understood that the semiconductor structure 200 illustrated in FIG. 3 only serves to facilitate the following discussion with respect to method 100 and thus does not limit embodiments of the present disclosure thereto.

Processing steps 110, 120, 130 (including steps 132 and 134), 140 (including steps 142, 144, 146, and 148), 150, and 160 of method 100 are described with respect to cross-sectional views of the semiconductor 200 taken along direction AA of one of the fins 222 and taken along direction BB of a source/drain region of the fins 222.

Referring to FIG. 3, the substrate 210 includes a crystalline material that can generally be described to have an ordered atomic structure, or a crystalline structure. In some embodiments, the substrate 210 includes one elementary semiconductor having a crystalline structure, such as, for example, silicon. Alternatively or additionally, the substrate 210 includes another elementary semiconductor, such as germanium; a compound semiconductor, such as silicon carbide, gallium arsenide, gallium phosphide, indium phosphide, indium arsenide, and/or indium antimonide; an alloy semiconductor, such as silicon germanium (SiGe), GaAsP, AlInAs, AlGaAs, GaInAs, GaInP, and/or GaInAsP; or combinations thereof. Alternatively, the substrate 210 is a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods.

In some embodiments, forming the fin structure 220 (i.e., the fins 222) also results in the formation of the isolation regions 230. As shown in FIG. 4B, each fin 222 formed by embodiments provided herein has a height $H_f$, which is measured from a top surface of the isolation regions 230 to a top surface of the fin. In some embodiments, the height $H_f$ is about 30 nm to about 200 nm. In some embodiments, the isolation regions 230 include, for example, silicon oxide, silicon nitride, silicon oxynitride, an air gap, other suitable dielectric materials, or combinations thereof. The isolation regions 230 can include different structures such as, for example, STI, deep trench isolation (DTI) structures, and/or local oxidation of silicon (LOCOS) structures.

The fin structure 220 and the isolation regions 230 can be formed by any suitable process. In an exemplary embodiment, the process can include the following steps: a photolithography process for forming a patterned resist layer on the substrate 210 and transferring (e.g., by an etching process) the pattern onto a hard mask layer (not shown), an etching process (e.g., a dry etching and/or wet etching process) to etch trenches in the substrate 210 not covered by the patterned hard mask layer, and a deposition process (e.g., a chemical vapor deposition process and/or a spin-on glass process) to fill in the trenches with one or more insulating materials to form the isolation regions 230. The trenches may be partially filled, where the substrate remaining between trenches forms the fins 222. The hard mark layer may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over the substrate 210 and patterned using a photolithography process. Spacers are formed alongside the patterned sacrificial layer using a self-aligned process. The sacrificial layer is then removed, and the remaining spacers, or mandrels, become the patterned hard mask layer.

Alternatively, the fins 222 and the isolation regions 230 can be formed by the following process: depositing an insulating material over the substrate 210 to completely fill the trenches, planarizing a top surface of the filled trenches to remove any excessive insulating material using, for example, a polishing process such as chemical mechanical polishing/planarization (CMP), and selectively growing one or more layers of epitaxial semiconductor materials over the exposed substrate 210 thereby forming the fins 222 with isolation regions 230 disposed in between the fins 222. The epitaxial semiconductor material can be, for example, such as silicon, germanium, silicon germanium, other suitable materials, or combinations thereof. In some embodiments, the filled trenches may have a multi-layer structure such as a thermal oxide liner layer filled with silicon nitride or silicon oxide. Accordingly, the fins 222 formed by embodiments provided herein may comprise the same material as the substrate 210 or, alternatively, they may comprise one or more layers of epitaxially grown semiconductor materials over the substrate 210.

In some embodiments, the photolithography process includes performing a pre-exposure baking process of a resist layer disposed over a hard mask layer formed on the substrate 210, performing an exposure process using a mask, performing a post-exposure baking process of the resist layer, and performing a developing process to form a patterned resist layer. During the exposure process, the resist layer is exposed to radiation energy (such as ultraviolet (UV) light, deep UV (DUV) light, or extreme UV (EUV) light), where the mask blocks, transmits, and/or reflects radiation to the resist layer depending on the pattern of the mask and/or mask type (e.g., binary mask, phase shift mask, or EUV mask), such that an image is transferred onto the resist layer that corresponds to the mask's pattern. Since the resist layer is sensitive to radiation energy, exposed portions of the resist layer chemically change, and a developing process can be used to remove exposed or non-exposed portions of the resist layer depending on characteristics of the resist layer and/or a developing solution used during the developing process. In some embodiments, the photolithography process employs techniques such as laser patterning, electron-beam patterning, and/or ion-beam patterning to directly form a pattern on the resist layer without using a mask.

After development, the pattern on the resist layer is transferred to the hard mask layer and subsequently used to form trenches in the substrate 210 by one or more etching processes. The hard mask layer includes any suitable material, for example, silicon oxide, silicon nitride, silicon carbide, silicon oxycarbide, silicon oxynitride, spin-on glass (SOG), a low-k film, tetraethylorthosilicate (TEOS), plasma-enhanced oxide (PE-oxide), high-aspect-ratio-process (HARP) formed oxide, or other suitable materials formed by a suitable method, such as thermal oxidation, chemical vapor deposition (CVD), high-density plasma CVD (HDP-CVD), physical vapor deposition (PVD), atomic-layer deposition (ALD), other suitable methods, or a combination thereof. An exemplary etching process can include a dry etching process, a wet etching process, other suitable etching process, or combinations thereof. In some embodiments, a reactive ion etching (RIE) process is performed. After the etching process, the patterned resist layer and the hard mask layer are removed from the substrate 210, for example, by a stripping process and/or by plasma ashing.

In the depicted embodiments, the semiconductor structure 200 further comprises two gate structures 240 formed over the substrate 210. It is understood that additional gate structures similar to the gate structure 240 illustrated herein can be formed over the depicted fins 222 parallel to the gate structure 240. Each gate structure 240 engages a top portion and sidewall portions of the fins 222, i.e., engaging three sides of the fins 222 in a channel region as depicted herein.

Figure 4A:
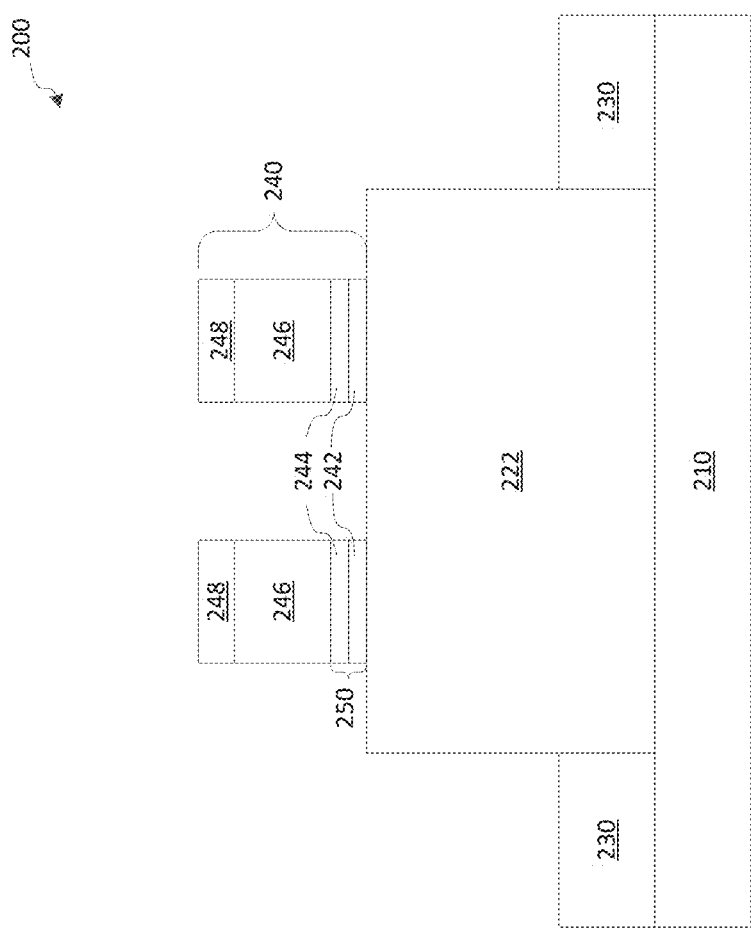
FIGS. 4A, 5A, 6A, 8A, and 9A are fragmentary cross-sectional views of a semiconductor structure along line AA as shown in FIG. 3 and according to various aspects of the present disclosure.
Figure 4B:
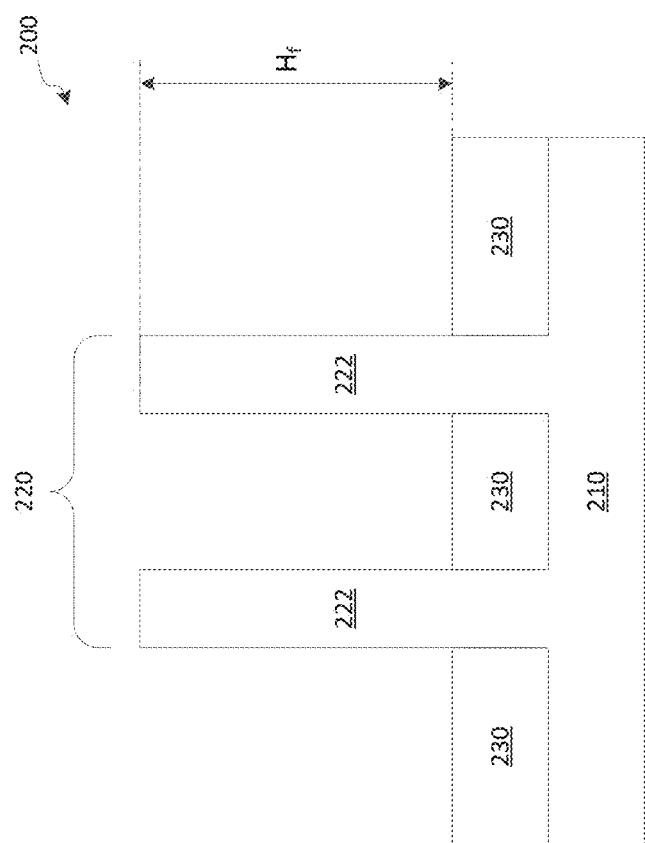
FIGS. 4B, 5B, 6B, 7, 8B, 9B, 10, 11, and 12 are fragmentary cross-sectional views of a semiconductor structure along line BB as shown in FIG. 3 and according to various aspects of the present disclosure.

As shown in an embodiment of the semiconductor structure 200 in FIG. 4A, the gate structure 240 includes a dielectric layer 250, a gate electrode layer 246, and a hard mask layer 248. It is understood that the gate structure 240 may include additional layers such as capping layers, diffusion/barrier layers, dielectric layers, conductive layers, other suitable layers, and/or combinations thereof. For example, the dielectric layer 250 may include an interfacial layer (IL) 242 and a gate dielectric layer 244. The IL is formed over the isolation regions 230 and the fin structure 220. The IL 242 is formed by any suitable process to any suitable thickness. An exemplary IL includes silicon oxide (e.g., thermal oxide or chemical oxide) and/or silicon oxynitride (SiON).

The gate dielectric layer 244 is formed over the IL 242 and comprises a dielectric material such as, for example, silicon oxide, silicon nitride, silicon oxynitride, high-k dielectric material, other suitable dielectric material, and/or combinations thereof. Examples of high-k dielectric material includes $HfO_2$, HfSiO, HfSiON, HfTaO, HfTiO, HfZrO, zirconium oxide ($ZrO_2$), aluminum oxide ($Al_2O_3$), hafnium dioxide-alumina ($HfO_2$—$Al_2O_3$) alloy, other suitable high-k dielectric materials, and/or combinations thereof.

The gate electrode layer 246 is formed over the dielectric layer 250 and includes any suitable material such as, for example, polysilicon, aluminum, copper, titanium, tantalum, tungsten, molybdenum, tantalum nitride, nickel silicide, cobalt silicide, TiN, WN, TiAl, TiAlN, TaCN, TaC, TaSiN, metal alloys, other suitable materials, and/or combinations thereof.

The hard mask layer 248 is formed over the gate electrode layer 246 by any suitable process. The hard mask layer 248 includes any suitable material, for example, silicon nitride, SiON, SiC, SiOC, spin-on glass (SOG), a low-k film, tetraethylorthosilicate (TEOS), plasma enhanced CVD oxide (PE-oxide), high-aspect-ratio-process (HARP) formed oxide, and/or other suitable material.

Each material layer of the gate structure 240 as provided herein is formed by any suitable process or processes. For example, each material layer can be formed by a procedure including deposition, photolithography patterning, and etching processes. The deposition processes include, for example, CVD, PVD, ALD, HDP-CVD, metal organic CVD (MO-CVD), remote plasma CVD (RP-CVD), plasma enhanced CVD (PE-CVD), plating, other suitable methods, and/or combinations thereof. The photolithography patterning processes include photoresist coating (e.g., spin-on coating), soft baking, mask aligning, exposure, post-exposure baking, developing the photoresist, rinsing, drying (e.g., hard baking), other suitable processes, and/or combinations thereof. Alternatively, the photolithography exposing process is implemented or replaced by other proper methods such as maskless lithography, electron-beam (e-beam) writing, ion-beam writing, and/or nanoimprint technology for patterning the resist layer. The etching process can include a dry etching process, a wet etching process, other suitable etching process, or combinations thereof. In some embodiments, an RIE process is performed.

In some embodiments, the gate structure 240 formed is a dummy gate structure, portions of which can be subsequently replaced with a high-k/metal gate (MG) structure after high thermal budget processes are performed. In some embodiments, the dummy gate structure includes a dummy dielectric layer similar to the dielectric layer 250 described above, a dummy gate electrode layer that comprises polysilicon and/or other suitable materials, a hard mask layer similar to the hard mask layer 248, and any other suitable material layers (e.g., capping layers, diffusion and/or barrier layers, dielectric layers, conductive layers, other suitable layers, and/or combinations thereof).

Figure 5A:
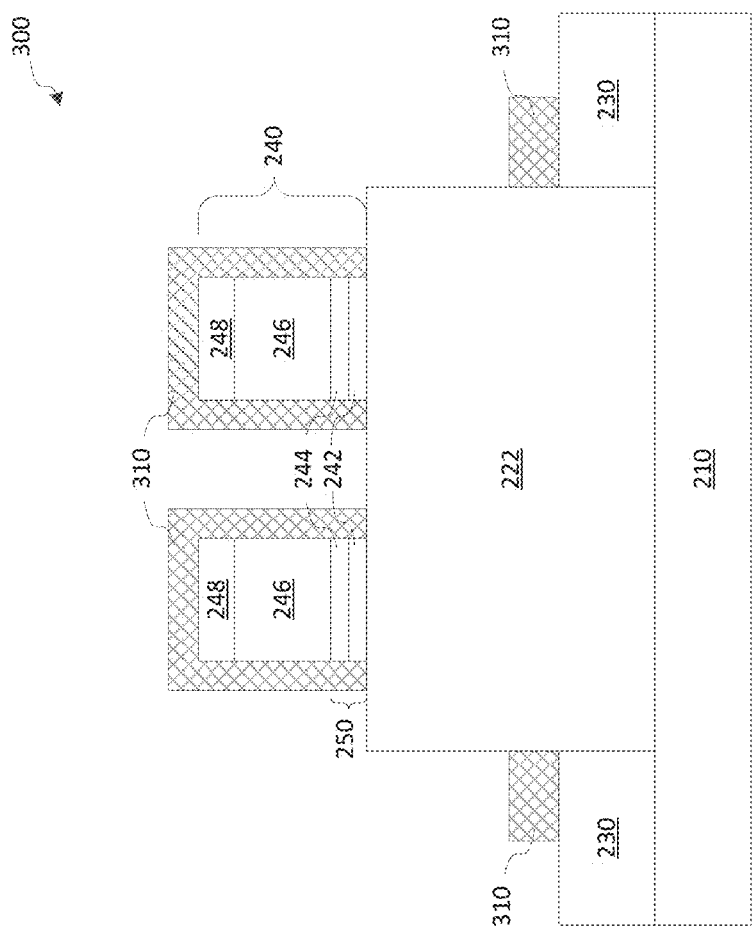
Figure 5B:
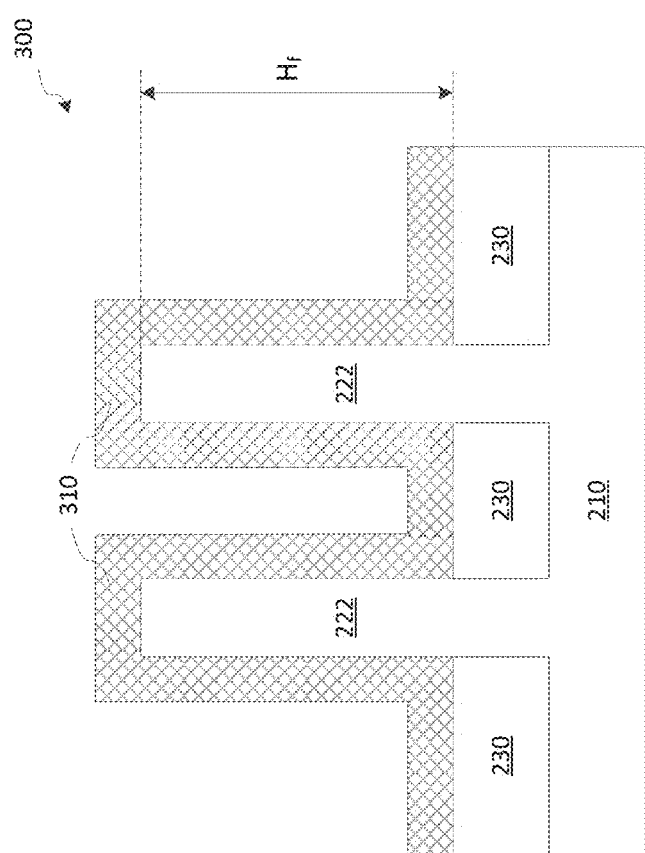

Referring back to FIG. 1, method 100 proceeds to step 120 in which a sidewall material layer 310 is formed over the semiconductor structure 200. As shown in FIGS. 5A and 5B, the sidewall spacer material layer 310 is formed over the gate structure 240 and the fin structure 220 resulting in a modified semiconductor structure 300. The sidewall spacer material layer 310 generally includes a dielectric material such as silicon nitride, silicon oxide, silicon carbide, silicon oxynitride, or combinations thereof. The sidewall spacer material layer 310 can be formed by any suitable process or processes. In the depicted embodiment, the sidewall spacer material layer 310 is formed by depositing a dielectric material over the gate structure 240 and the fins 222 in one or more processes. The deposition processes can be implemented by, for example, CVD, HDP-CVD, PVD, ALD, other suitable methods, or a combination thereof.

Figure 6A:
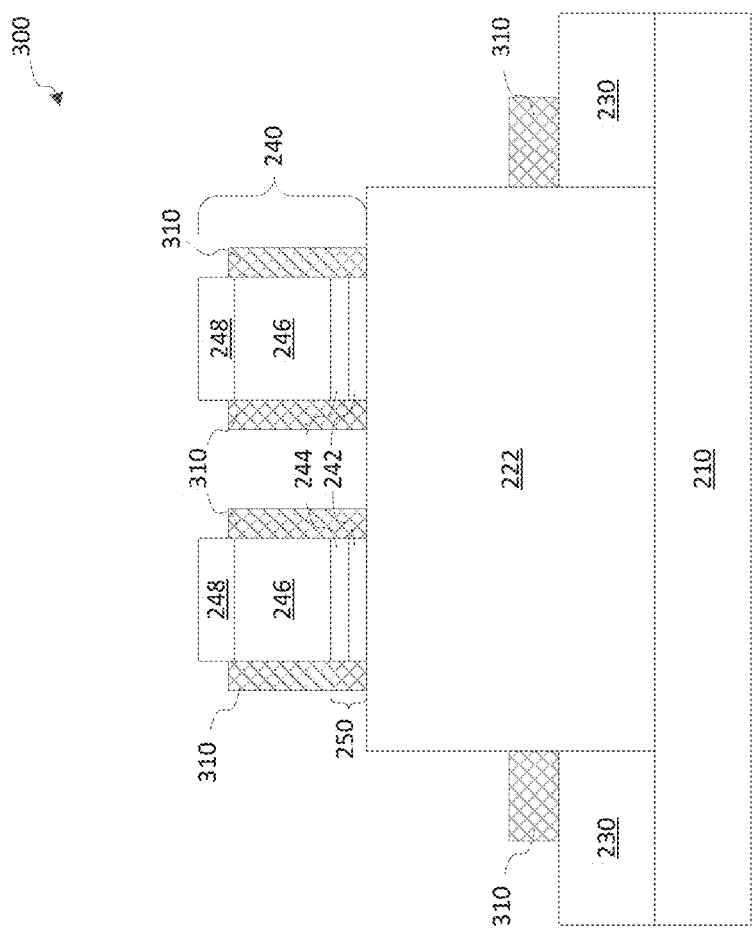
Figure 6B:
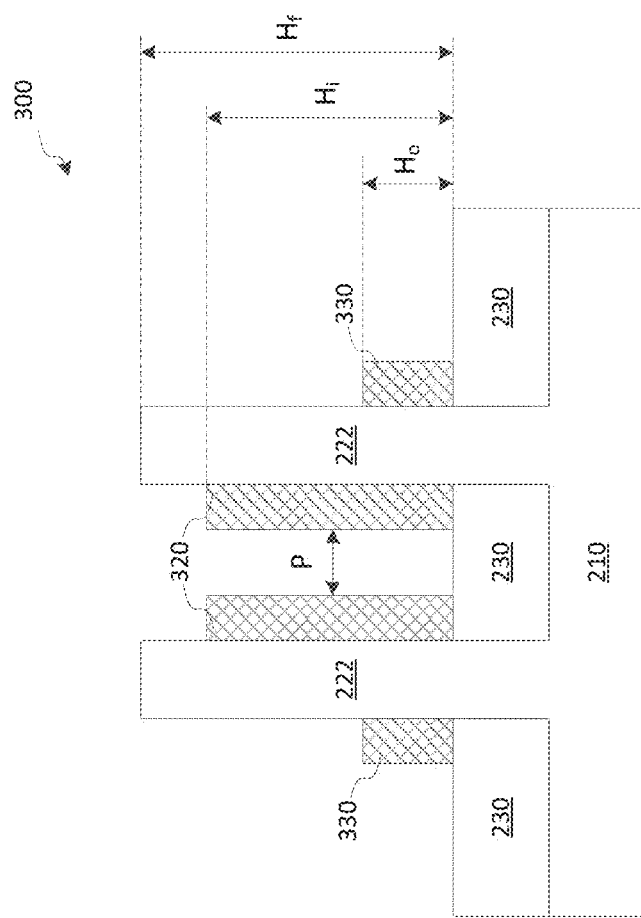

Still referring to FIG. 1, method 100 proceeds to method 130, or alternatively to method 140, during which inner fin spacers 320 and outer fin spacers 330 are formed as shown in embodiments of FIG. 6B. Generally, the sidewall spacer material layer 310 is anisotropically etched back to form gate spacers along sidewalls of the gate structure 240 (FIG. 6A) and the inner fin spacers 320 and the outer fin spacers 330 along sidewalls of each fin 222 (FIG. 6B). In some embodiments, the etching back process may include a multiple-step etching to gain etch selectivity, flexibility, and desired control for over etching.

Figures 2A, 2B:
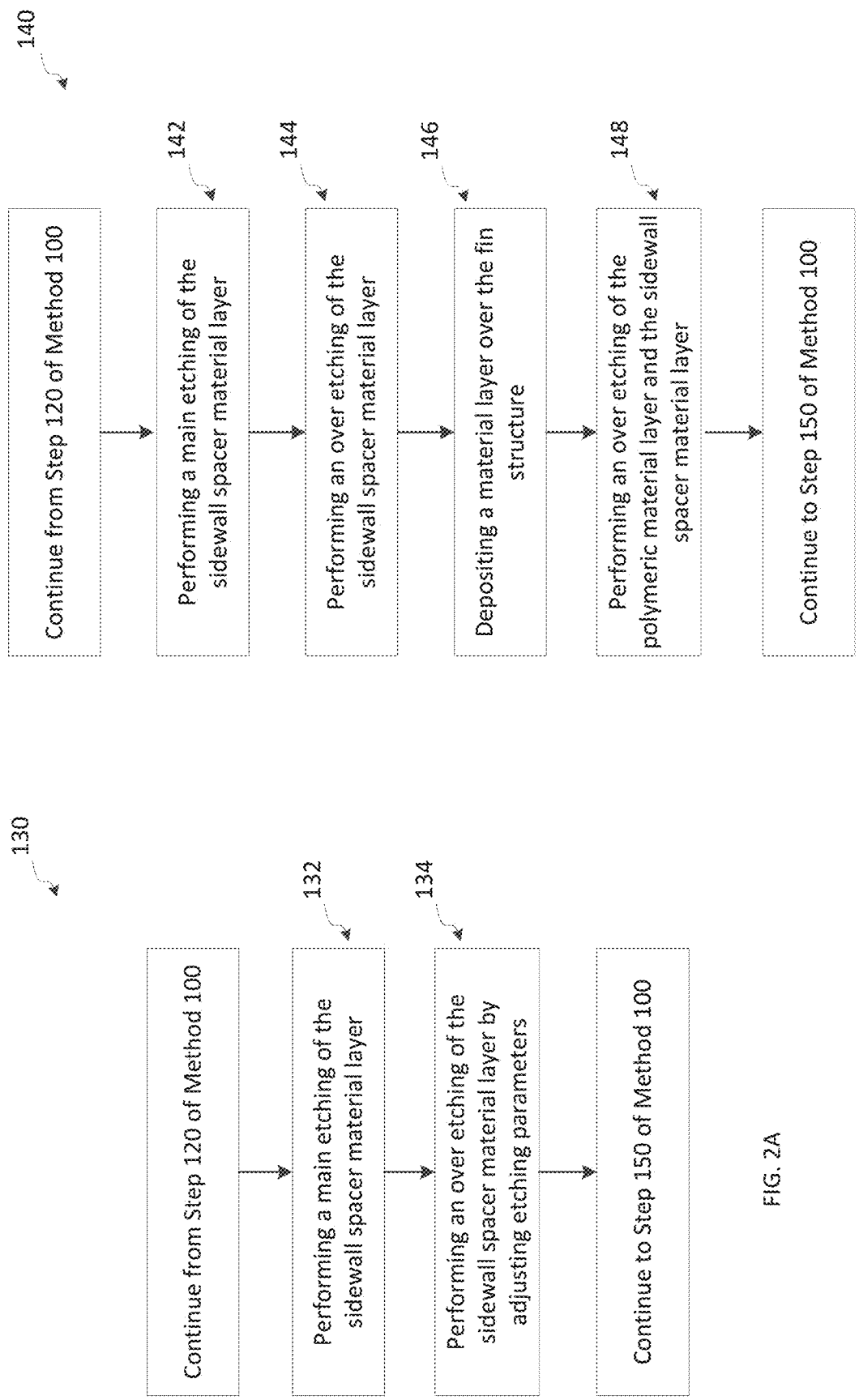
FIGS. 2A and 2B are flowcharts of exemplary methods for fabricating a semiconductor structure according to various aspects of the present disclosure.

Referring to FIG. 2A, method 130 begins with step 132 by performing a main etching process of the sidewall spacer material layer 310. In some embodiments, performing the main etching process includes performing a dry etching process. Exemplary dry etchant gasses include one or more of CO, $CO_2$, $CH_3F$, $SO_2$, $CH_4$, Ar, $CF_4$, HBr, $O_2$, $NF_3$, $SF_6$, and He. To achieve anisotropic etching, the dry etching process may also be performed using such mechanisms as deep reactive-ion etching (DRIE). Alternatively, the main etching process may also be implemented by applying a wet etching process. The wet etching solution includes, for example, a tetramethylammonium hydroxide (TMAH), a HF/$HNO_3$/$CH_3COOH$ solution, or other suitable solutions.

Method 130 proceeds to step 134 during which an over etching of the sidewall spacer material layer 310 is implemented. Exemplary dry etchant gasses used during the over etching process include one of more of $CH_3F$, $O_2$, and $CH_4$. In some embodiments, the etch rate of the sidewall spacer material layer 310 disposed on the inner sidewalls of the fins 222 is lower than the etch rate of the sidewall spacer material layer 310 disposed on the outer sidewalls of the fins 222, resulting in inner fin spacers 320 being etched back to a lesser extent than the outer fin spacers 330. This difference in etch rate may be due to the fact that there is less etchant gas available to react with the spacer material layer in the space between the fins 222 than outside the fins 222. As a result, the inner fin spacers 320 are etched more slowly than the outer fin spacer 330. The etching process of step 134 may also be performed by tuning one or more of the etching parameters such as, for example, etching temperature, etching pressure, source power, RF bias voltage, RF bias power, etchant flow rate, and other suitable parameters. In the depicted embodiment, the bias voltage of the etching process at step 134 may be reduced to below about 300 V to achieve the etching results desired. Furthermore, high-voltage bias pulsing (HVBP) may also be used at step 134 to implement precise control over the etching process such that the inner fin spacers 320 are etched back to a lesser extent than the outer fin spacers 330.

Figure 7:
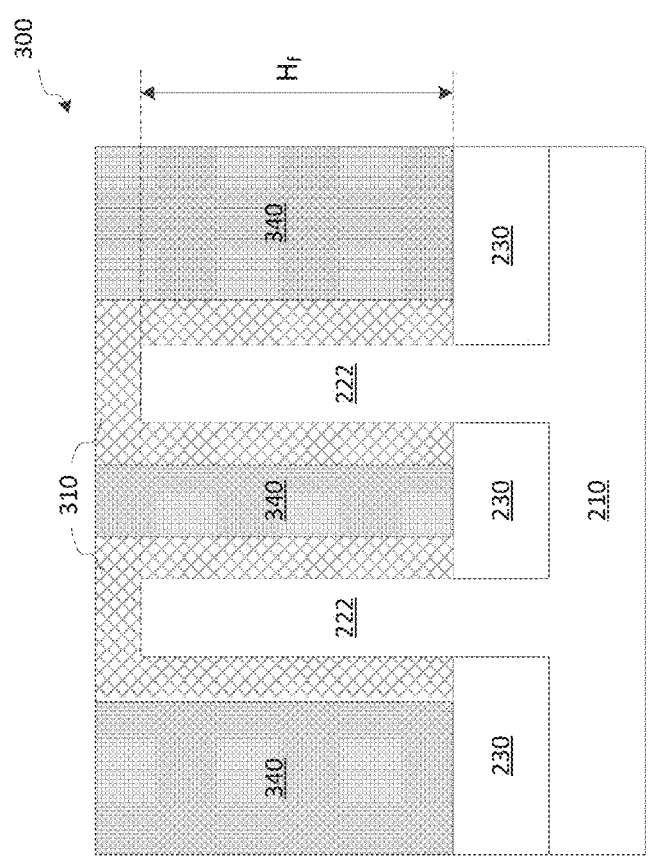

Referring to FIG. 2B, in an alternative embodiment, step 120 proceeds to method 140 by performing a main etching process 142 followed by an over etching process 144, which are similar to steps 132 and 134, respectively, as discussed above. Then, method 140 proceeds to step 146 as shown in FIG. 7 by depositing a material layer 340 over the fin structure 220 such that open space between and adjacent to the fins 222 is completely filled with the material layer 340. In some embodiments, the material layer 340 includes a polymeric material such as, for example, $CH_4$ or $CH_3F$ delivered in an inert carrier gas such as, for example, Ar or N. Alternatively, the material layer 340 can include a dielectric material such as silicon nitride, silicon oxide, silicon carbide, silicon oxynitride, silicon carbonitride, silicon oxycarbonitride, other suitable materials, or combinations thereof, provided that the material layer 340 is different from the sidewall spacer material layer 310. The deposition process can be implemented by, for example, CVD, PVD, ALD, HDP-CVD, MO-CVD, RP-CVD, PE-CVD, plating, other suitable methods, and/or combinations thereof.

Following the deposition of the material layer 340, method 140 proceeds to step 148 during which the material layer 340 and the sidewall spacer material layer 310 are anisotropically etched back using one or more etchant gasses described with respect to step 132. In some embodiments, a bias voltage between about 1 V and about 800 V is applied during the etching back process of the sidewall spacer material layer 310. In the depicted embodiment, the bias voltage is less than about 300 V to implement precise control over the etching process. Similar to the discussion above with respect to the etching process at step 134, HVBP may be used at step 134 to implement precise control over the etching process such that the inner fin spacers 320 are etched back to a lesser extent than the outer fin spacers 330. In some embodiments, the material layer 340 is completely etched away following the completion of step 148, while the sidewall spacer material layer 310 is partially etched such that the inner fin spacers 320 and the outer fin spacers 330 are formed on the sidewalls of the fins 222 as shown in FIG. 6B. In many embodiments, similar to the reasoning discussed above with respect to step 134, the added material layer 340 further limits the amount of the etchant gas available to react with the spacer material 310 and, as a result, reduces the rate of the etching of the inner fin spacers 320 in comparison to that of the outer fin spacers 330.

Accordingly, the extent of etching provided by method 130 and method 140 is controlled to achieve an inner fin spacer height $H_i$ and an outer fin spacer height $H_o$, where $H_i$ is substantially greater than $H_o$ as depicted in FIG. 6B. In some embodiments, the extent of etching is controlled by adjusting one or more etching parameters together or independently to achieve desired relative heights of the inner and the outer fin spacers. It is understood that each of a and $H_o$ is measured from a bottom surface to a top surface of the respective fin spacers with the bottom surface of the inner fin spacers 320 being coplanar with the bottom surface of the outer fin spacers 330. In the depicted embodiments, the bottom surface of the inner fin spacers 320 and the outer fin spacers 330 are in physical contact with a top surface of the isolated regions 230 surrounding the fin structure 220. In some embodiments, $H_i$ is greater than or equal to half of the fin height $H_f$. In some embodiments, the inner fin spacers 320 and the outer fin spacers 330 can be further described by a pitch P, which is the separation distance between the inner fin spacers 320. In some embodiments, the pitch P is a minimum pitch achievable between the fins 222 by a lithography process for a given technology node. For example, in the depicted embodiment shown in FIG. 6B, $H_f$ is about 30 nm to about 200 nm, P is about 0.1 nm to about 50 nm, and the relationship between $H_i$, $H_o$ and $H_f$ can be described by the following equations:

$$H_i \gg H_o, \text{ and}$$

$$H_i > 0.5 H_f.$$

The present disclosure contemplates variations in $H_i$ with respect to $H_o$ as they influence the formation of epitaxial structures in FinFET devices.

Referring back to FIG. 1, method 100 proceeds to step 150 by recessing the fins 222 to form a trench 410, as shown in FIGS. 8A-8B and 9A-9B. In some embodiments, the recessing process includes an etching process that selectively etches the fins 222 over other features of the modified FinFET precursor 300. In the present embodiment, the source/drain regions of the fins 222 are recessed by etching while the channel regions are protected from etching by the gate structure 240. The etching process may be a dry etching process, a wet etching process, or combinations thereof. In some embodiments, a wet etching process implements an etching solution including potassium hydroxide (KOH). In some embodiments, a wet etching process implements an etching solution that includes ammonium hydroxide ($NH_4OH$), hydrogen peroxide ($H_2O_2$), sulfuric acid ($H_2SO_4$), tetramethylammonium hydroxide (TMAH), other suitable wet etching solution, or combinations thereof. For example, the wet etching solution can utilize an $NH_4OH$:$H_2O_2$ solution, an $NH_4OH$:$H_2O_2$:$H_2O$ solution (known as an ammonia-peroxide mixture (APM)), or an $H_2SO_4$:$H_2O_2$ solution (known as a sulfuric peroxide mixture (SPM)). In some embodiments, a dry etching process employs an etchant gas that includes a fluorine-containing etchant gas (e.g., $CF_4$, $SF_6$, $CH_2F_2$, $CHF_3$, and/or $C_2F_6$), an oxygen-containing gas, a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, helium, other suitable gases and/or plasmas, or combinations thereof. In some embodiments, the recessing process implements an oxidation process. For example, the recessing process can expose the fins 222 to an ozone environment, thereby oxidizing a portion of the fins 222, which is subsequently removed by a cleaning process and/or an etching process, such as those described herein.

By controlling factors influencing the recessing process (e.g., the recessing time, the recessing process conditions, or other recessing parameters), a profile of the fins 222 can be modified to meet various design requirements of the final desired FinFET device. For example, where the recessing process includes an etching process, various etching parameters such as etchant used, etching temperature, etching pressure, source power, RF bias voltage, RF bias power, etchant flow rate, and/or other suitable etching parameters, can be modified to remove a desired amount of fins 222 and/or to achieve a desired profile of fins 222.

Figure 8A:
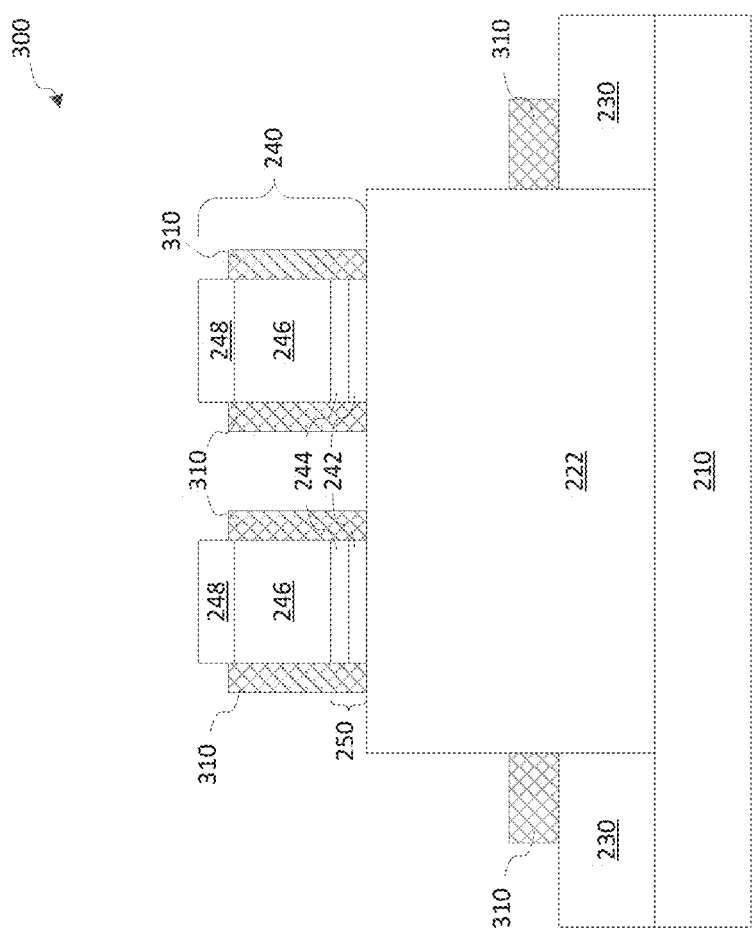
Figure 8B:
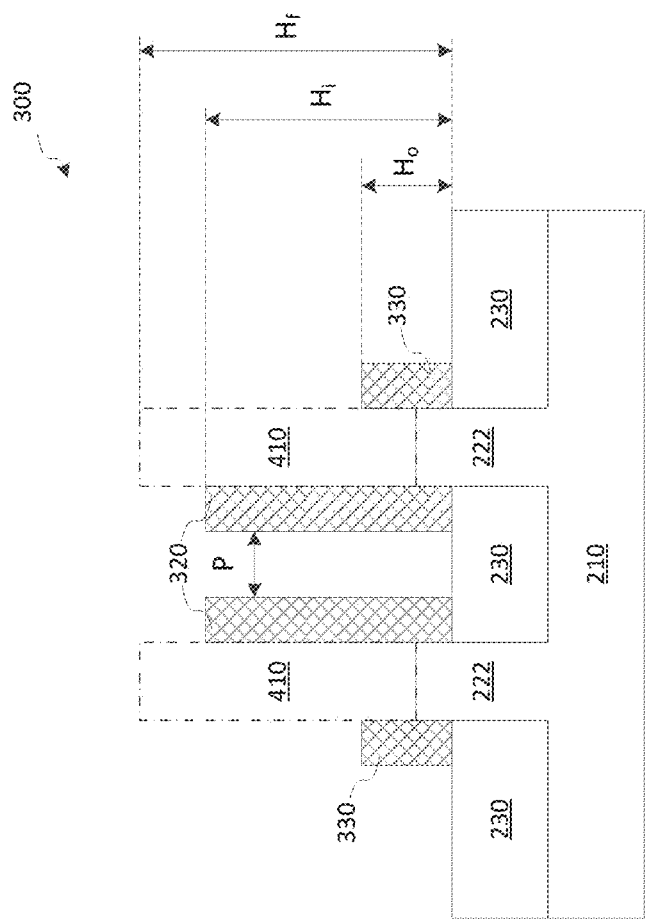
Figure 9A:
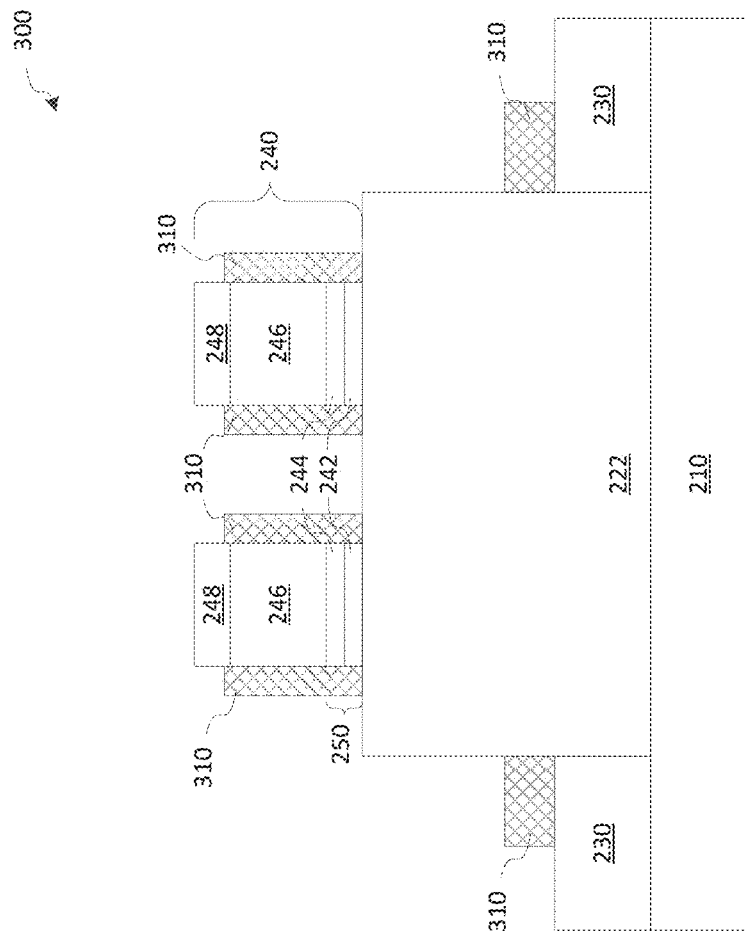
Figure 9B:
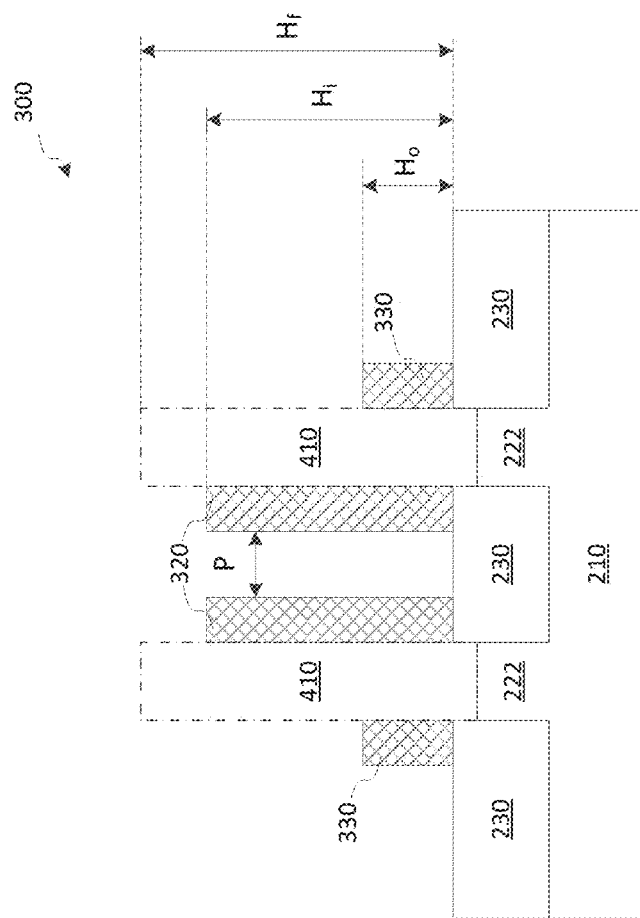

In the depicted embodiments, the trench 410 is formed by etching both fins 222 to substantially the same height and the same profile. As shown in FIGS. 8A-8B, for example, top surfaces of the fins 222 are etched such that they are above top surfaces of the isolated regions 230, while an alternative embodiment such as that depicted in FIGS. 9A-9B provide that the top surfaces of fins 222 are etched such that they are below the top surfaces of the isolated regions 230. In some embodiments, sidewalls of the trench 410 are substantially and vertically parallel to each other.

Referring back to FIG. 1, method 100 proceeds to step 160 during which an epitaxial structure 460 is formed over the fin structure 220, thereby merging the fins 222 in a source/drain region of the semiconductor structure 400. As shown in the depicted embodiment of FIG. 10, the epitaxial structure 460 includes three epitaxial (EPI) layers: EPI layer 420, EPI layer 430, and EPI layer 440. It is understood, however, that the epitaxial structure 460 is not limited to three EPI layers and can include, for example, one, two, or four EPI layers. Each EPI layer is formed by epitaxially growing a semiconductor material on exposed surfaces of the recessed fins 222 and/or of other EPI layers. A suitable epitaxial semiconductor material includes, for example, a single element semiconductor material such as germanium (Ge) or silicon (Si); or a compound semiconductor material, such as gallium arsenide (GaAs), aluminum gallium arsenide (AlGaAs); or a semiconductor alloy, such as silicon germanium (SiGe), gallium arsenide phosphide (GaAsP). For embodiments that include more than one EPI layers, the epitaxial materials of the EPI layers may be the same or different. Furthermore, each EPI layer may have any suitable crystallographic orientation such as, for example, <100>, <110>, or <111> families of crystallographic orientations. In the depicted embodiment, referring to FIG. 10, the EPI layer 420 is formed to a thickness 442 (e.g., from about 1 nm to about 10 nm), the EPI layer 430 is formed to a thickness 444 (e.g., from about 5 nm to about 60 nm), and the EPI layer 440 is formed to a thickness 446 (e.g., from about 1 nm to about 10 nm). In one example, a ratio of the thickness 442, the thickness 444, and the thickness 446 is about 1:5:1.

In some embodiments, the epitaxial structure 460 is a feature in the source and the drain region, referred to as epitaxial source/drain features. In some embodiments, the epitaxial structure 460 may include various dopants. For example, where an NMOS FinFET device is desired, the epitaxial structure 460 may include one or more EPI layers of silicon (epi Si) or silicon carbon, where the silicon or silicon carbon is doped with an n-type dopant such as arsenic, phosphorus, other n-type dopant, or combinations thereof. Alternatively, where a PMOS FinFET device is desired, the epitaxial structure 460 may include one or more EPI layers of silicon germanium (epi SiGe), where the silicon germanium is doped with a p-type dopant such as boron, germanium, indium, other p-type dopant, or combinations thereof. The three EPI layers 420, 430, and 440 depicted in FIGS. 10 and 11 may comprise different dopants or different concentrations of the same dopant. In some embodiments, the EPI layers 420, 430, and 440 include different concentrations of a dopant. For example, the EPI layer 420 may include a dopant concentration of less than about 1E21 atom/cm$^3$, the EPI layer 430 may include a dopant concentration of from about 1E21 atom/cm$^3$ to about 1E22 atom/cm$^3$, and the EPI layer 440 may include a dopant concentration of less than about 1E21 atom/cm$^3$. In the depicted embodiment, a ratio of the dopant concentration between EPI layers 420, 430, and 440 is about 1:10:1.

Any suitable process (e.g., an ion implantation process, a diffusion process, an in-situ doping process, or combinations thereof) can be implemented for doping the epitaxial semiconductor material deposited over the recessed fins 222. In some embodiments, a selective epitaxial growth (SEG) process is performed to grow an EPI layer of semiconductor material on the recessed fins 222, where dopants are introduced into the semiconductor material during the SEG process (e.g., by adding dopants to a source material of the SEG process) forming a doped EPI layer. The SEG process can be implemented with any deposition technique, such as CVD, PVD, ALD, HDP-CVD, MO-CVD, RP-CVD, PE-CVD, low-pressure CVD (LP-CVD), atomic layer CVD (AL-CVD), atmospheric pressure CVD (AP-CVD), vapor-phase epitaxy (VPE), ultra-high vacuum CVD (UHV-CVD), molecular beam epitaxy, other suitable processes, or combinations thereof. The SEG process can use gaseous precursors (e.g., silicon-containing gases, such as $SiH_4$ and/or germanium-containing gases, such as $GeH_4$) and/or liquid precursors, which interact with a composition of the fins 222 to form EPI Si or EPI SiGe layers. One or more annealing processes may be performed to activate the epitaxial structure 460. The annealing processes include rapid thermal annealing (RTA) and/or laser annealing processes.

Figure 10:
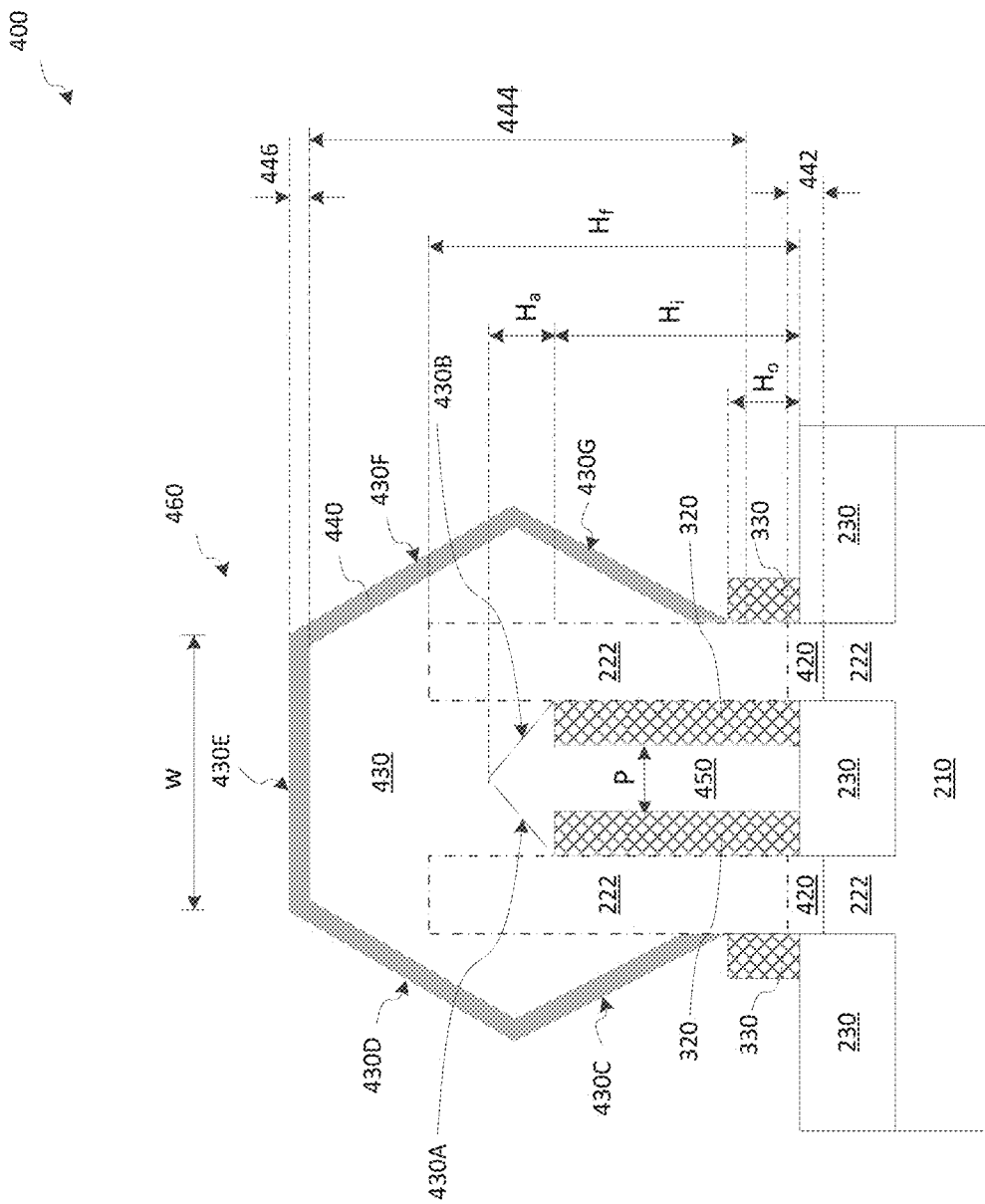
Figure 11:
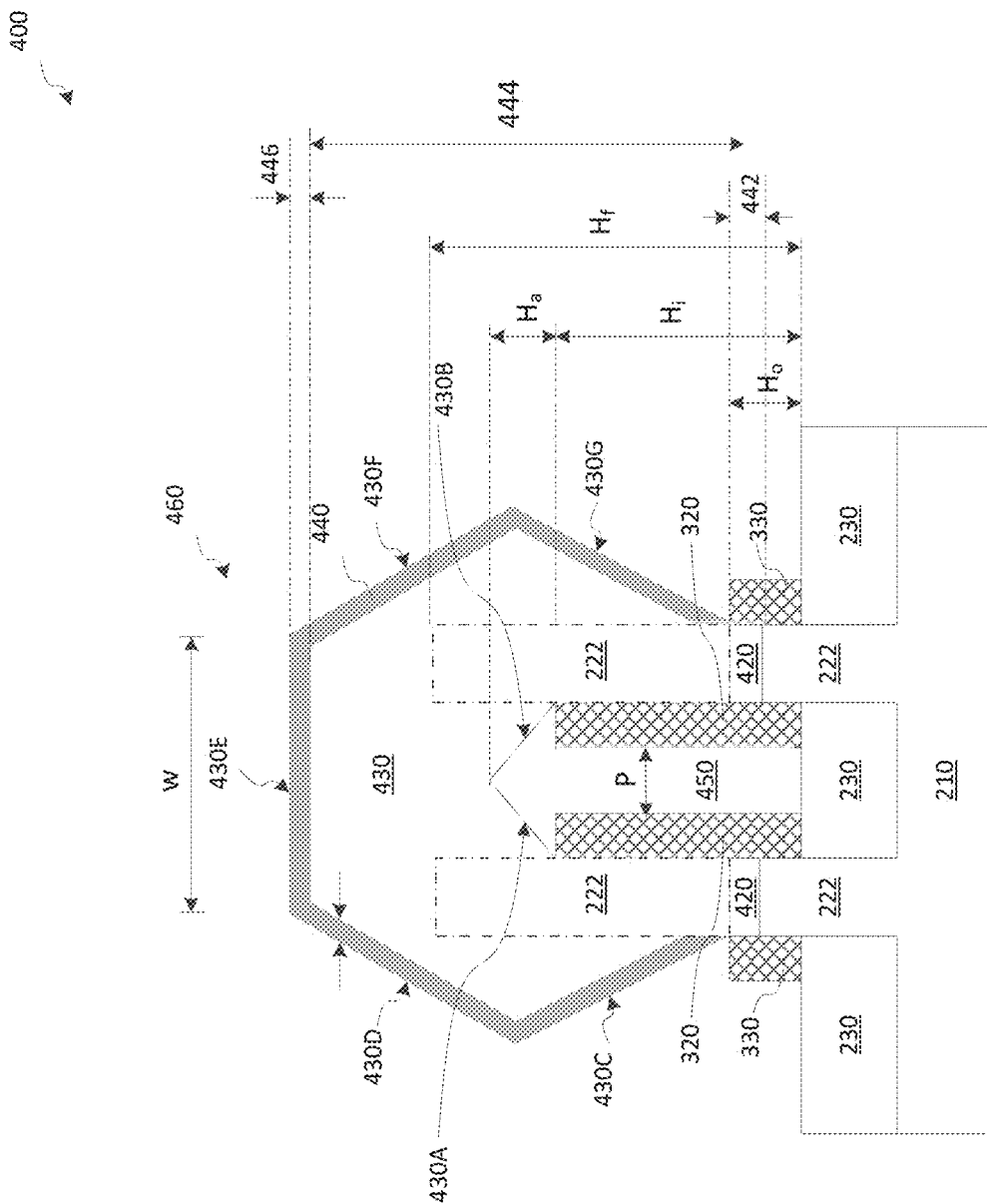

According to embodiments depicted in FIGS. 10 and 11 in which the epitaxial structure 460 includes three EPI layers, the first, second, and third EPI layers are formed over the fin structure 220 in that order. Initially, the first EPI layer 420 is formed over an exposed top surface of each of the recessed fins 222. Though the first EPI layer 420 as depicted has a top surface that is coplanar with a top surface of the outer fin spacers 330, embodiments of the present disclosure are not limited to this configuration. For example, the top surface of the first EPI layer 420 may be above or below the top surfaces of the outer fin spacers 330. Further, as discussed above, top surfaces of the recessed fins 222 may be above (e.g., FIG. 11) or below (e.g., FIG. 10) top surfaces of the isolated regions 230. Following the formation of the first EPI layer 420, the second EPI layer 430 is formed over the first EPI layer 420 as a substrate material. As shown in the depicted embodiments, the second EPI layer 430 forms multiple outer facets 430C-430F due to the direction of crystallographic growth of the epitaxial semiconductor material in the second EPI layer 430. These facets 430C-430F provide a substrate for the epitaxial growth of the third EPI layer 440, which is formed conformally over the facets 430C-430F.

Figure 12:
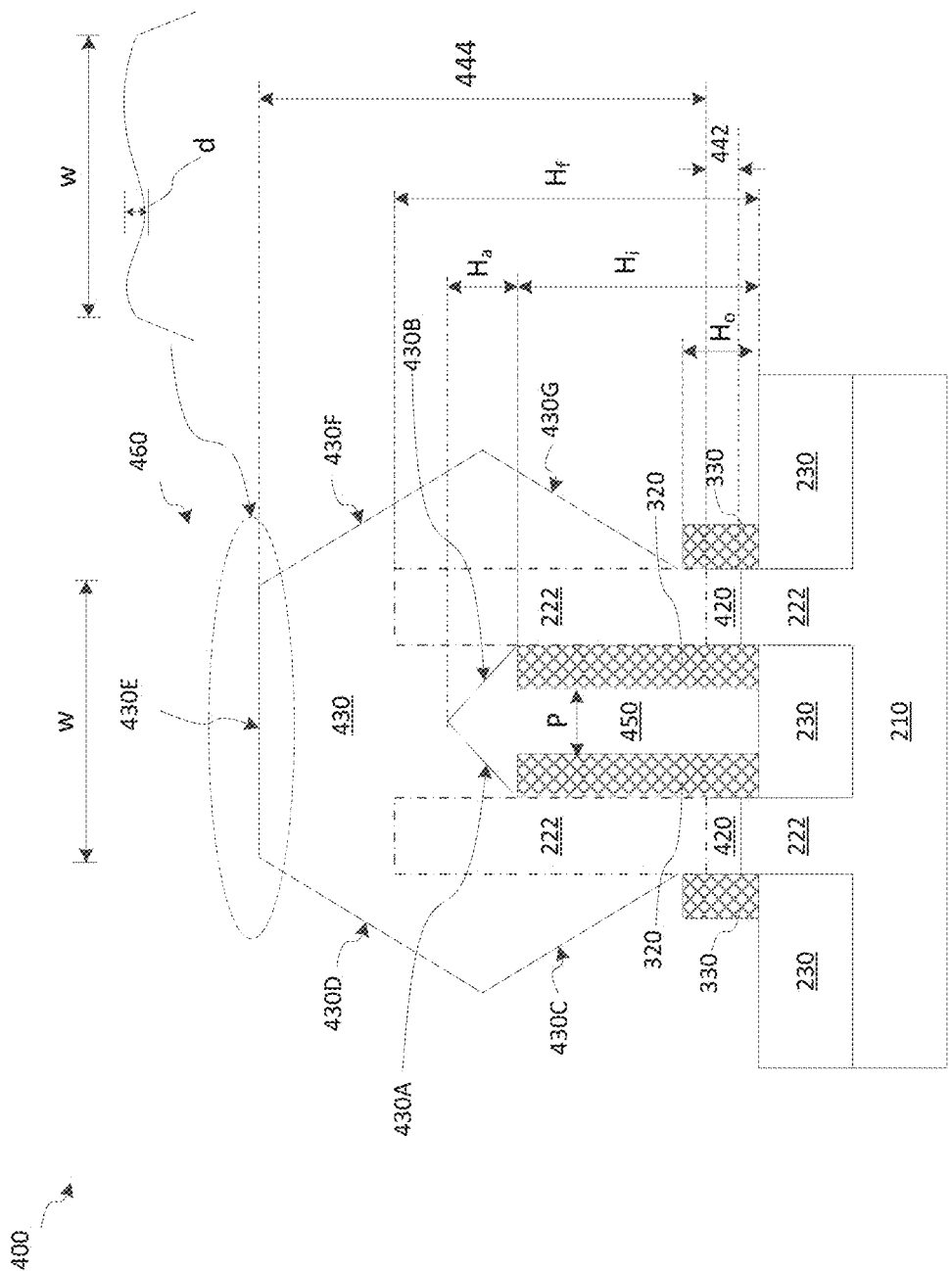

During the deposition process of the second EPI layer 430, an air gap 450 is formed within the epitaxial structure 460 as depicted in FIGS. 10-12. The air gap 450 includes a first portion formed by the inner fin spacers 320 that has a height defined by the inner fin spacer height $H_i$ and a width defined by the inner fin spacer pitch P. The air gap 450 further includes a second portion formed by top surfaces of the inner fin spacers 320 and two inner facets 430A-430B of the second EPI layer 430, such that the second portion has a height $H_a$. In the depicted embodiment, a ratio of $H_a$ to $H_i$ is from about 1:3 to about 1:2, and a sum of $H_a$ and $H_i$ is about 30% to about 80% of the fin height $H_f$. Accordingly, the total volume of the air gap 450 is the sum of the first portion and the second portion and is a function of P, and/or the material implemented in the formation of the second EPI layer 430. In the depicted embodiments, the height of the inner fin spacers 320 can be readily adjusted by modifying the extent of the etching back of the sidewall spacer material layer 310 as implemented by methods 130 and 140.

In the depicted embodiment, the EPI layers 430 and 440 may grow to have five outer facets (e.g., 430C-430G) and form a C-shaped epitaxial structure due to the presence of the air gap 450. Alternatively, the EPI layers 430 and 440 may grow to have four outer facets and form a diamondshaped epitaxial structure. For an exemplary embodiment depicted in FIG. 10 in which the EPI layers 430 and 440 include five outer facets 430C-430G, the facet directly above the fin structure 220, e.g., facet 430E, is substantially parallel to the top surfaces of the recessed fins 222. It is understood that these outer facets may not be equal in width w. For example, the width w of the facet 430E may be smaller than the width w of other facets of the second EPI layer 430. Furthermore, while the facet 430E is depicted to be flat in FIGS. 10 and 11, some embodiments provide that the facet 430E may include variations in its topography. For example, as shown in FIG. 12, the difference d between a lowest point and a highest point on the topography of the facet 430E may be non-zero and less than 5% of the thickness 444 of EPI layer 430. While in the depicted embodiment the EPI layers 430 and 440 include facets connecting at sharp corners, the present disclosure is not limited herein and may provide embodiments in which the corners are smooth or rounded.

For embodiments in which RC delays in an IC comprising FinFET devices (e.g., the semiconductor structure 400 depicted herein) are sought to be reduced, greater capacitance (C) resulting from larger air gap volume (e.g., volume of air gap 450) within the epitaxial source/drain structures is desired. Advantageously, the present disclosure provides embodiments in which the volume of such air gap can be modified by adjusting the height of the inner fin spacers $H_i$ via controlled etching processes as discussed herein.

Additional steps can be provided before, during, and after the method 100, and some of the steps described can be replaced, eliminated, or moved around for additional embodiments of the method 100. For example, method 100 may further include replacing the dummy gate structures 240 with high-k MG structures following the formation of the epitaxial structure 460.

The semiconductor structure 400 as provided herein may be included in a microprocessor, a memory, and/or other integrated circuit device. In some embodiments, the semiconductor structure 400 may be a portion of an IC chip, a system on chip (SoC), or portion thereof, that includes various passive and active microelectronic devices such as resistors, capacitors, inductors, diodes, metal-oxide semiconductor field effect transistors (MOSFET), complementary metal-oxide semiconductor (CMOS) transistors, bipolar junction transistors (BJTs), laterally diffused MOS (LDMOS) transistors, high voltage transistors, high frequency transistors, other suitable components, or combinations thereof. Additional features can be added to the semiconductor structure 400 by subsequent processing steps. For example, various vertical interconnect features such as contacts and/or vias, and/or horizontal interconnect features such as lines, and multilayer interconnect features such as metal layers and interlayer dielectrics can be formed over the substrate 210, configured to connect the various features or structures of the semiconductor structure 400. The various interconnect features may implement various conductive materials including aluminum, aluminum alloy (e.g., aluminum/silicon/copper alloy), copper, copper alloy, titanium, titanium nitride, tantalum, tantalum nitride, tungsten, polysilicon, metal silicides, other suitable metals, or combinations thereof. The metal silicides may include nickel silicide, cobalt silicide, tungsten silicide, tantalum silicide, titanium silicide, platinum silicide, erbium silicide, palladium silicide, or combinations thereof.

Accordingly, the present disclosure provides many different embodiments of epitaxial structures in FinFET devices and methods of fabricating the same. In one aspect, an exemplary semiconductor structure (e.g., a FinFET device) is provided and includes a fin structure comprising a pair of fins formed on a substrate, inner fin spacers formed along inner sidewalls of the fins, outer fin spacers formed along outer sidewalls of the fins, and an epitaxial structure formed over both fins. In some embodiments, the inner fin spacers are described by a fin spacer height $H_i$ and a fin spacer pitch P, while the outer fin spacers are described by fin spacer height $H_o$. Some embodiments provide that $H_o$ is substantially less than $H_i$ and that $H_i$ is at least half of the height of the fins. In some embodiments, the epitaxial structure formed over the fins merges the fins together and encloses therein an air gap formed by the inner fin spacers and the epitaxial structure. In some embodiments, a height of a portion of the air gap above the inner fin spacers is about ⅓ to about ½ of $H_i$.

In one aspect, the present embodiments provide a method that includes forming a first fin and a second fin protruding from a semiconductor substrate and defined by a fin height, forming a spacer layer over the first fin and the second fin, etching the spacer layer to form inner spacers and outer spacers along opposite sidewalls of each of the first fin and the second fin, where the inner spacers are formed between the first fin and the second fin and where etching the spacer layer results in the inner spacers to extend above the outer spacers, forming a source/drain (S/D) recess in each of the first fin and the second fin, and forming an epitaxial semiconductor layer in the S/D recesses, where forming the epitaxial semiconductor layer forms an air gap with the inner spacers.

In another aspect, the present embodiments provide a method that includes providing a semiconductor substrate, forming a first fin and a second fin over the semiconductor substrate, forming inner fin spacers and outer fin spacers on sidewalls of the first fin and the second fin, where the inner fin spacers disposed between the first fin and the second fin have a first height and where the outer fin spacers disposed opposite to the inner fin spacers have a second height that is less than the first height, forming a source/drain (S/D) feature over an S/D region of each of the first fin and the second fin, wherein forming the S/D feature creates an air gap with the inner fin spacers, and forming a gate structure over a channel region of each of the first fin and the second fin.

In yet another aspect, the present embodiments provide a method that includes forming a first fin and a second fin adjacent to the first fin over a semiconductor substrate, where the first fin and the second fin are defined by a fin height, forming a dielectric layer over the first fin and the second fin, etching the dielectric layer to form inner spacers and outer spacers opposite to the inner spacers on sidewalls of the first fin and the second fin, where the inner spacers are disposed between the first fin and the second fin and extend above the outer spacers, and forming a source/drain (S/D) feature to merge channel regions of the first fin and the second fin, where forming the S/D feature forms an air gap with the inner spacers.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
a first fin and a second fin protruding from a semiconductor substrate;
isolation features disposed over the semiconductor substrate to separate the first and the second fins, wherein a top surface of each of the first and the second fins is below a top surface of the isolation features;
inner fin spacers disposed along inner sidewalls of the first and the second fins, wherein the inner fin spacers have a first height measured from a top surface of the isolation features;
outer fin spacers disposed along outer sidewalls of the first and the second fins, wherein the outer fin spacers have a second height measured from the top surface of the isolation features that is less than the first height; and
a source/drain (S/D) structure merging the first and the second fins, wherein the S/D structure includes an air gap having a top portion disposed over the inner fin spacers, wherein the S/D structure further includes a first epitaxial layer, a second epitaxial layer over the first epitaxial layer, and a third epitaxial layer over the second epitaxial layer, wherein the first, the second, and the third epitaxial layers include different dopant concentrations.

2. The semiconductor structure of claim 1, wherein a bottom portion of the air gap is disposed between the inner fin spacers.

3. The semiconductor structure of claim 2, wherein the top portion of the air gap is defined by a third height and the bottom portion of the air gap is defined by a fourth height, and wherein the third height is about ⅓ to about ½ of the fourth height.

4. The semiconductor structure of claim 1, wherein the S/D structure includes a plurality of facets, wherein the facet directly above the air gap is substantially parallel to the top surfaces of the first and the second fins.

5. The semiconductor structure of claim 1, wherein a height of the air gap measured from the top surface of the isolation features is less than the height of the first and the second fins measured from the top surface of the isolation features.

6. The semiconductor structure of claim 5, wherein the height of the air gap is about 30% to about 80% of the height of the first and the second fins.

7. The semiconductor structure of claim 1, wherein the first epitaxial layer interfaces with at least one of the isolation features.

8. A semiconductor structure, comprising:
a first fin and a second fin protruding from a semiconductor substrate;
isolation features disposed over the semiconductor substrate to separate the first and the second fins, wherein a top surface of each of the first and the second fins is below a top surface of the isolation features;
inner fin spacers disposed along inner sidewalls of the first and the second fins;
outer fin spacers formed along outer sidewalls of the first and the second fins, wherein the outer fin spacers have a height less than that of the inner fin spacers;
a source/drain (S/D) structure disposed over the first and the second fins, wherein a top portion of the S/D structure that laterally spans from the first fin to the second fin is substantially parallel to top surfaces of the first fin and the second fin, wherein the S/D structure includes a first epitaxial layer, a second epitaxial layer over the first epitaxial layer, and a third epitaxial layer over the second epitaxial layer, wherein the first, the second, and the third epitaxial layers include different dopant concentrations; and
an air gap disposed in the S/D structure, wherein the air gap includes a top portion disposed over the inner fin spacers.

9. The semiconductor structure of claim 8, wherein the inner fin spacers have a height measured from the top surface of the isolation features that is greater than half of a height of the first and the second fins measured in a channel region from the top surface of the isolation features.

10. The semiconductor structure of claim 8, wherein the air gap exposes the top surface of the isolation features.

11. The semiconductor structure of claim 8, wherein the top portion of the air gap has a first height and a bottom portion of the air gap below the top portion has a second height, and wherein the first height is less than the second height.

12. The semiconductor structure of claim 11, wherein the first height is about 30% to about 80% of the second height.

13. The semiconductor structure of claim 8, wherein a top surface of the first epitaxial layer is above the top surface of each of the first and the second fins.

14. The semiconductor structure of claim 8, wherein the top portion of the S/D structure is disposed over a top facet of the second epitaxial layer.

15. The semiconductor structure of claim 8, wherein a portion of the second epitaxial layer is exposed to the air gap.

16. A semiconductor structure, comprising:
a first fin and a second fin protruding from a semiconductor substrate;
isolation features disposed over the semiconductor substrate to separate the first and the second fins, wherein a top surface of each of the first and the second fins is below a top surface of the isolation features;
inner fin spacers disposed along inner sidewalls of the first and the second fins;
outer fin spacers formed along outer sidewalls of the first and the second fins, wherein the outer fin spacers have a height less than that of the inner fin spacers;
an air gap disposed between and protruding over the inner fin spacers; and
a source/drain (S/D) structure disposed over the first and the second fins, wherein the S/D structure includes an epitaxial layer disposed over the inner fin spacers, wherein the epitaxial layer and top surfaces of the inner fin spacers define a top portion of the air gap, and wherein a top portion of the S/D structure that laterally spans from the first fin to the second fin is substantially parallel to top surfaces of the first fin and the second fin, wherein the S/D structure includes a first semiconductor layer, a second semiconductor layer over the first semiconductor layer, and a third semiconductor layer over the second semiconductor layer, wherein the first, the second, and the third semiconductor layers include different dopant concentrations.

17. The semiconductor structure of claim 16, wherein the first and the second fin have a fin height measured in a channel region from the top surface of the isolation features, and wherein the height of the inner fin spacers is at least half of the fin height.

18. The semiconductor structure of claim 16, wherein the top portion of the air gap has a first height and a bottom portion of the air gap below the top portion has a second height, and wherein the first height is less than the second height.

19. The semiconductor structure of claim 16, wherein a top surface of the first semiconductor layer is above the top surface of each of the first and the second fins.

20. The semiconductor structure of claim 16, wherein the first and second semiconductor layers interface with at least one of the inner fin spacers and at least one of the outer fin spacers.

\* \* \* \* \*